United States Patent
Lee et al.

(10) Patent No.: US 7,554,873 B2
(45) Date of Patent: Jun. 30, 2009

(54) THREE-DIMENSIONAL MEMORY DEVICES AND METHODS OF MANUFACTURING AND OPERATING THE SAME

(75) Inventors: Ming Hsiu Lee, Hsinchu (TW); Yen Hao Shih, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 290 days.

(21) Appl. No.: 11/385,360

(22) Filed: Mar. 21, 2006

(65) Prior Publication Data
US 2006/0233082 A1    Oct. 19, 2006

Related U.S. Application Data

(60) Provisional application No. 60/663,866, filed on Mar. 21, 2005.

(51) Int. Cl.
*G11C 8/00* (2006.01)
(52) U.S. Cl. .................... 365/230.03; 365/63
(58) Field of Classification Search ............ 365/230.03, 365/63
See application file for complete search history.

(56) References Cited

U.S. PATENT DOCUMENTS

| | | | |
|---|---|---|---|
| 5,835,396 A | 11/1998 | Zhang | |
| 5,991,186 A * | 11/1999 | Balistreri et al. | 365/78 |
| 6,034,882 A | 3/2000 | Johnson et al. | |
| 6,504,742 B1 | 1/2003 | Tran et al. | |
| 6,687,147 B2 * | 2/2004 | Fricke et al. | 365/63 |
| 6,781,858 B2 * | 8/2004 | Fricke et al. | 365/51 |

* cited by examiner

*Primary Examiner*—Tuan T. Nguyen
(74) *Attorney, Agent, or Firm*—Jianq Chyun IP Office

(57) ABSTRACT

A memory device includes a plurality of planes of memory arrays, each memory array including a plurality of memory cells. The memory device also includes a plurality of word lines and bit lines coupled to the memory cells in each plane, and at least one transistor to select at least one of the memory arrays.

13 Claims, 12 Drawing Sheets

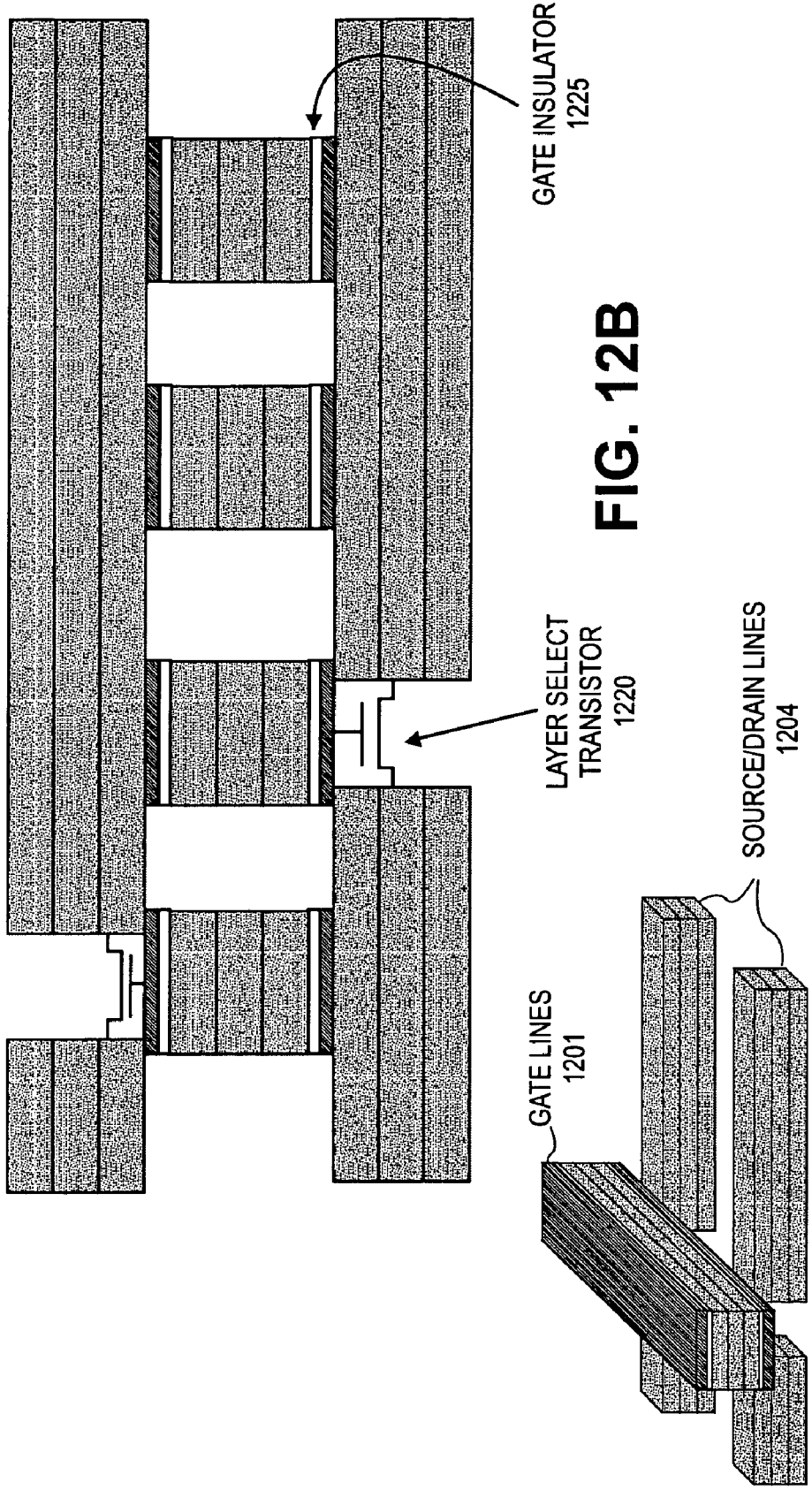

THREE-DIMENSIONAL MEMORY DEVICES AND METHODS OF MANUFACTURING AND OPERATING THE SAME

CROSS-REFERENCE TO RELATED APPLICATIONS

This application claims priority to U.S. Provisional Application No. 60/663,866, entitled "Three-Dimensional Memory Devices and Method of Manufacturing and Operating the Same", filed Mar. 21, 2005.

BACKGROUND OF THE INVENTION

The invention relates generally to memory devices and, more particularly, to three-dimensional memory devices and methods of manufacturing and operating the same. Specifically, the invention relates to decoding techniques for addressing memory cells in three-dimensional memory devices.

Advancements in electronic devices have increased the need for larger memory capacity. To increase memory capacity, memory devices have become smaller and more compact. Typically, memory devices include memory cells arranged in a two-dimensional array. Because of space limitations, increasing memory capacity requires innovated circuit designs for two-dimensional memory devices. One alternative design to increase memory capacity is forming memory cells in multiple layers or planes—i.e., a three-dimensional (3D) memory device.

Designing and debugging 3D memory devices, however, can be problematic. For instance, because memory cells are placed in multiple layers or planes, the electrical interconnections between the memory cells and to the substrate require intricate design. In particular, connecting electrical lines in every layer to the ground layer or substrate layer can be difficult to implement. In addition, addressing or handling memory cells across multiple layers complicates the design process. Thus, what is needed is a three-dimensional memory device allowing for simple handling and connection of memory cells across multiple layers or planes.

BRIEF SUMMARY OF THE INVENTION

According to one aspect of the invention, a memory device includes a plurality of planes of memory arrays, each memory array including a plurality of memory cells. The memory device also includes a plurality of word lines and bit lines coupled to the memory cells in each plane, and at least one transistor to select at least one of the memory arrays.

According to another aspect of the invention, a method of accessing memory cells is disclosed. A first signal is sent to at least one layer select transistor. The at least one layer select transistor is activated based on the first signal. Signals are communicated to or from one or more memory cells based on the activated at least layer select transistor.

According to another aspect of the invention, a memory device comprises at least two layers of memory arrays each containing at least four memory cells. The memory device further comprises at least two word lines in each layer coupled with the memory cells of the corresponding layer. The memory device also comprises at least two bit lines in each layer coupled with the memory cells of the corresponding layer, and at least a set of layer-selecting transistors for each layer, each set of the layer-selecting transistors being coupled to the memory cells of the corresponding layer.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIG. 12A illustrates another example of a three-dimensional schematic diagram of neighboring layer select transistors having source/drain lines and gate lines; and FIG. 12B illustrates one example of a cross-sectional view of the memory device of FIG. 12A;

DETAILED DESCRIPTION OF THE INVENTION

Examples consistent with the invention three-dimensional (3D) memory devices and techniques for addressing and handling memory cells in multiple planes or layers. The memory device may use thin-film-transistor (TFT) memory cells. The cells may be organized in planes each having a memory array, and the planes may be stacked vertically for providing multiple layers of memory arrays to form a three-dimensional (3D) memory matrix or device. Examples of memory devices described herein are disclosed in the related application, entitled "THREE-DEMENSIONAL MEMORY DEVICES," noted above.

To operate such memory devices, layer decoding techniques are disclosed that can transform the operation of a complex three-dimensional memory device to an operation scheme similar to that of a two-dimensional memory array. In some examples, the operation of a two-dimensional memory can be implemented in a three-dimensional memory device after a layer or plane (e.g., a horizontal plane) has been selected. The layer decoding techniques disclosed herein can improve the design and debugging process for three-dimensional memory devices.

To select a layer, in some examples, thin film transistors (TFTs) can be used as layer-selecting transistors. These TFTs may be formed together with each layer or plane of the memory arrays without forming them separately on the substrate, thereby saving space on the substrate and not requiring complicated circuitry on the periphery for memory addressing. By using such layer-selecting TFTs, an organized addressing scheme can be implemented with three-dimensional parameters, e.g., X and Y parameters can be used for addressing rows and columns of memory cells and a Z parameter can be used for addressing a particular layer or plane in the 3D memory device. The layer decoding scheme described herein allows for the number of layers or planes to be easily changed with minimal redesign of memory devices.

Figure 1:
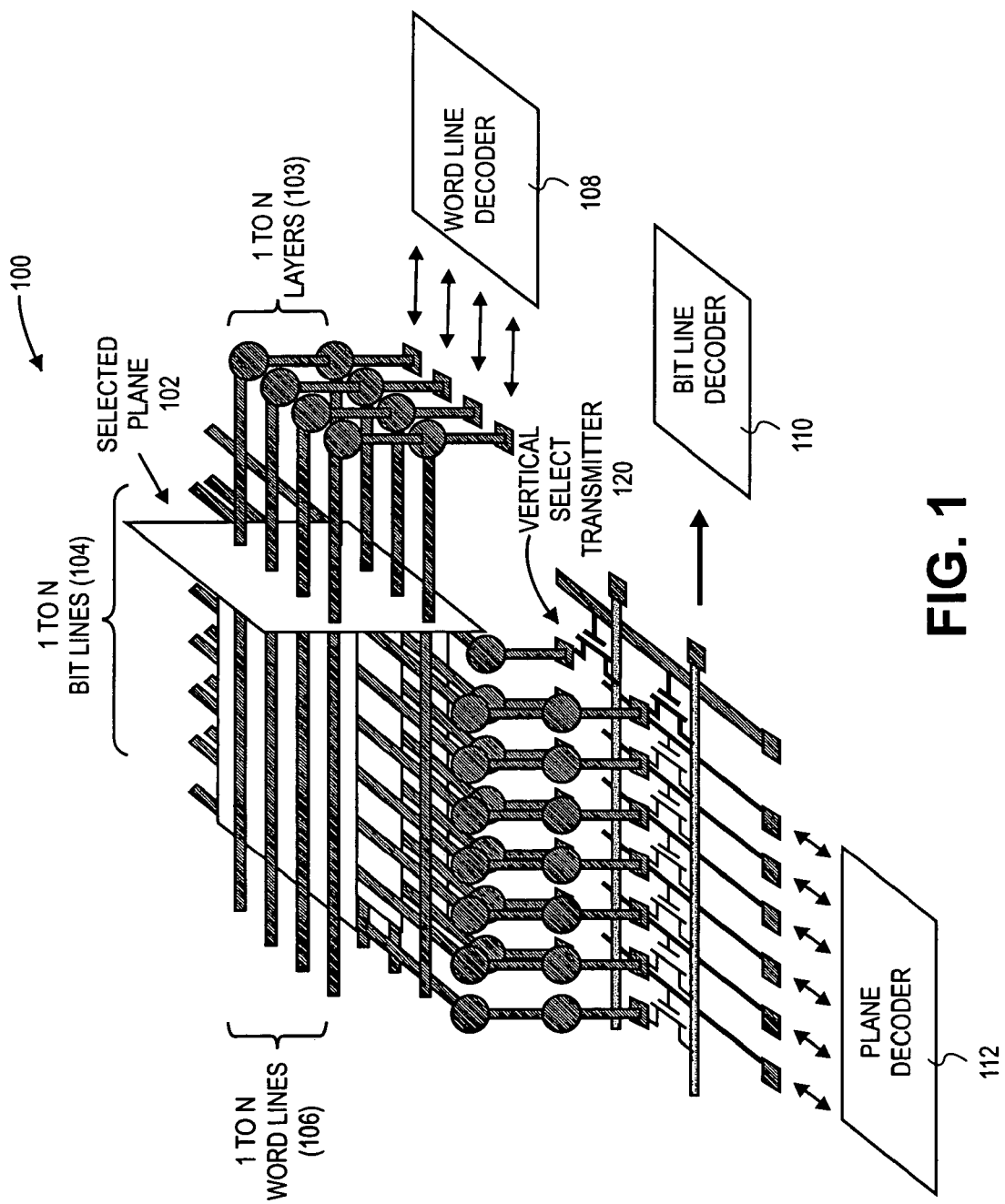
FIG. 1 illustrates an exemplary three-dimensional memory device that decodes and addresses memory cells in selected vertical planes.

FIG. 1 illustrates an exemplary three-dimensional memory device 100 that decodes and addresses memory cells using selected vertical planes 102. Memory device 100 includes 1 to N layers (103) having corresponding 1 to N word lines (106) and bit lines (104). Memory cells (not shown) are formed at the intersection of the word lines 106 and bit lines 104 on each layer 103. The word lines 106 of each layer 103 is connected to a word line decoder 108 and the bit lines 104 of each layer 103 is connected to a bit line decoder 110. Each layer 103 is connected to layer decoder 112. In this example, the memory cells may be decoded by defining a separate vertical plane 102 in which vertical plane decoder 112 selects the selected plane 102 via a vertical select transistor 120.

Figure 2:
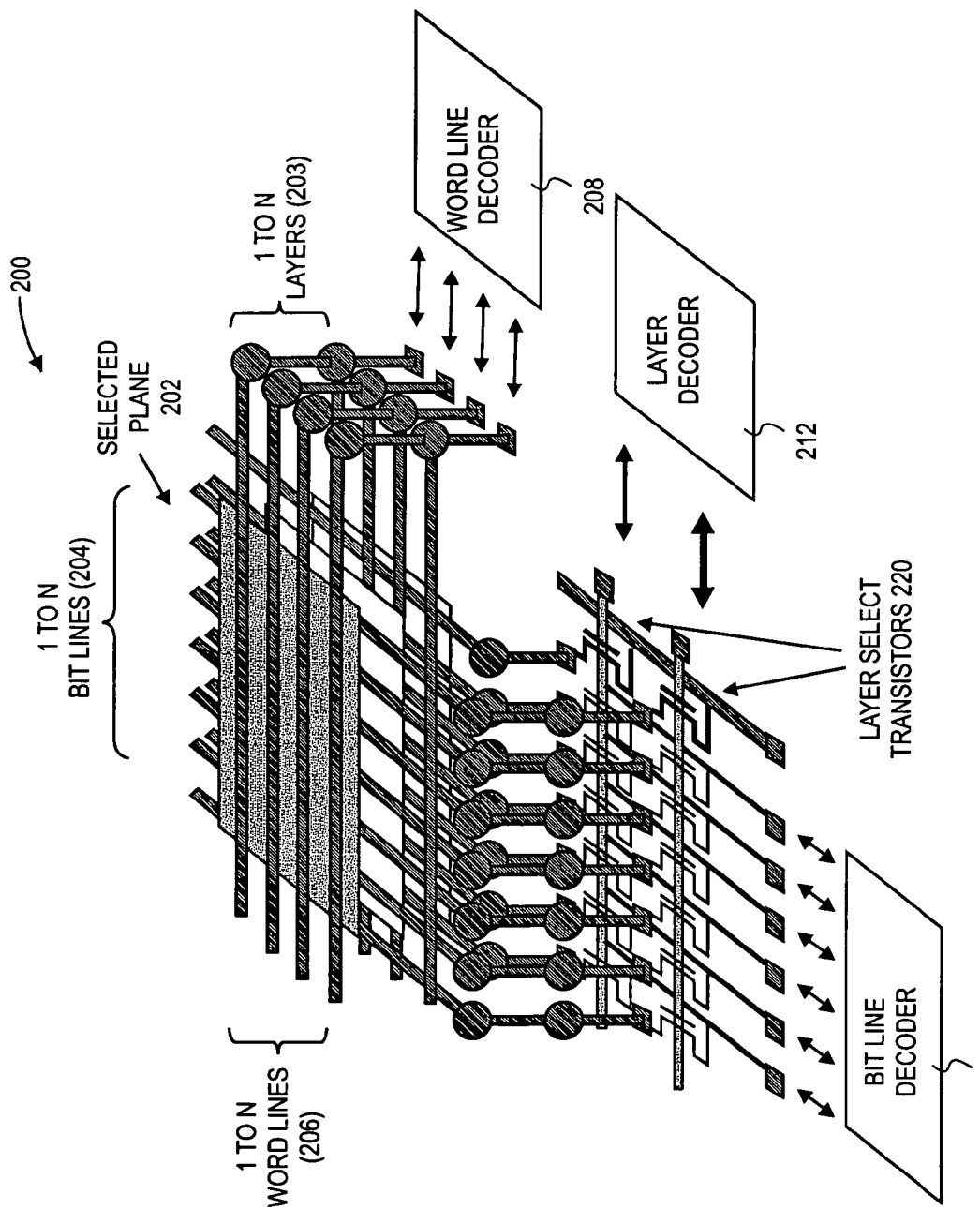
FIG. 2 illustrates an exemplary three-dimensional memory device that decodes and addresses memory cells in selected horizontal planes.

FIG. 2 illustrates an exemplary three-dimensional memory device 200 that decodes or addresses memory cells using a selected horizontal layer or plane 202. Memory device 200 includes 1 to N layers (203) having corresponding 1 to N word lines (206) and bit lines (204). Memory cells (not shown) are formed at the intersection of the word lines 206 and bit lines 204 on each layer 203. The word lines 206 of each layer 203 is connected to a word line decoder 208 and the bit lines 104 of each layer 203 is connected to a bit line decoder 210. Each layer 203 is connected to layer decoder 212. In this example, the memory cells may be decoded by defining separate horizontal layers or planes 202 in which a layer decoder 212 selects the selected horizontal plane 202 via appropriate layer select transistors 220. In one example, a single transistor can be used to select a horizontal plane 202 for decoding or addressing of memory cells. In this example, layer select transistors 220 can be formed on the ground layer of a substrate using conventional techniques. In other examples, corresponding layer select transistors 220 can be formed on individual planes 202 to avoid using space on the substrate.

Referring to selected horizontal plane 202, addressing or accessing memory cells the on the selected plane will now be described. Layer decoder 212 can receive 3D parameters such as a Z parameter for selecting the plane 202 and outputs a signal to activate respective layer select transistors 220 (e.g., the lower select transistor one in FIG. 2) that selects selected plane 202. In other examples, multiple transistors can be activated to select a plane. The word line decoder 208 and/or bit line decoder 210 can receive other 3D parameters such as X and Y parameters to access rows and columns of memory arrays in the selected plane 202. For example, word line decoder 208 can output a signal to activate one or more memory cells and data stored in the memory cells can be read on the bit lines by bit line decoder 210. Thus, memory cells may be decoded or addressed based on the horizontal plane the memory cells are located on.

Figure 3:
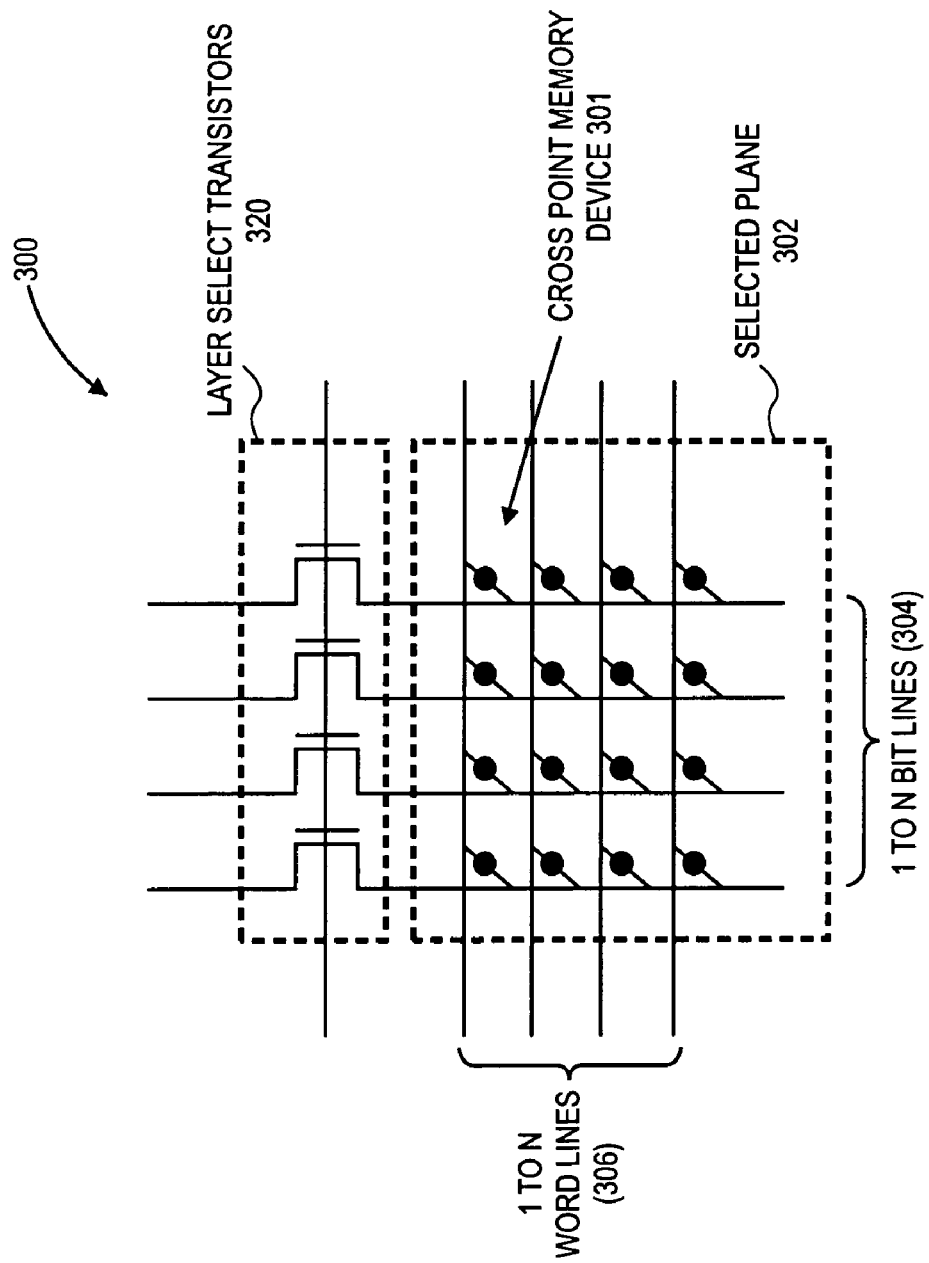
FIG. 3 illustrates an exemplary memory device having a selected horizontal plane with cross point memory devices.

FIG. 3 illustrates an exemplary memory device 300 having a selected horizontal plane 302 with cross point memory devices 301. Layer select transistors 320 are connected to an array of cross point memory devices 301, any of which can activate or choose the selected plane 302. These transistors 320 can be formed on the same plane as horizontal plane 302 or on a different one such as the ground level of the substrate. The array of cross point memory devices 301 is interconnected with 1 to N word lines (306) and bit lines (304). Examples of cross point memory devices may include multiple functional elements such as a rectifying element (e.g., a diode) and a memory state element (e.g., a fuse, anti-fuse, or a resistance variable device). These functional elements can be treated as separate and isolated devices and can be serially connected. Alternatively, these functional elements can be combined into a single device, such as, for example, a chalcogenide phase change resistor.

Figure 4:
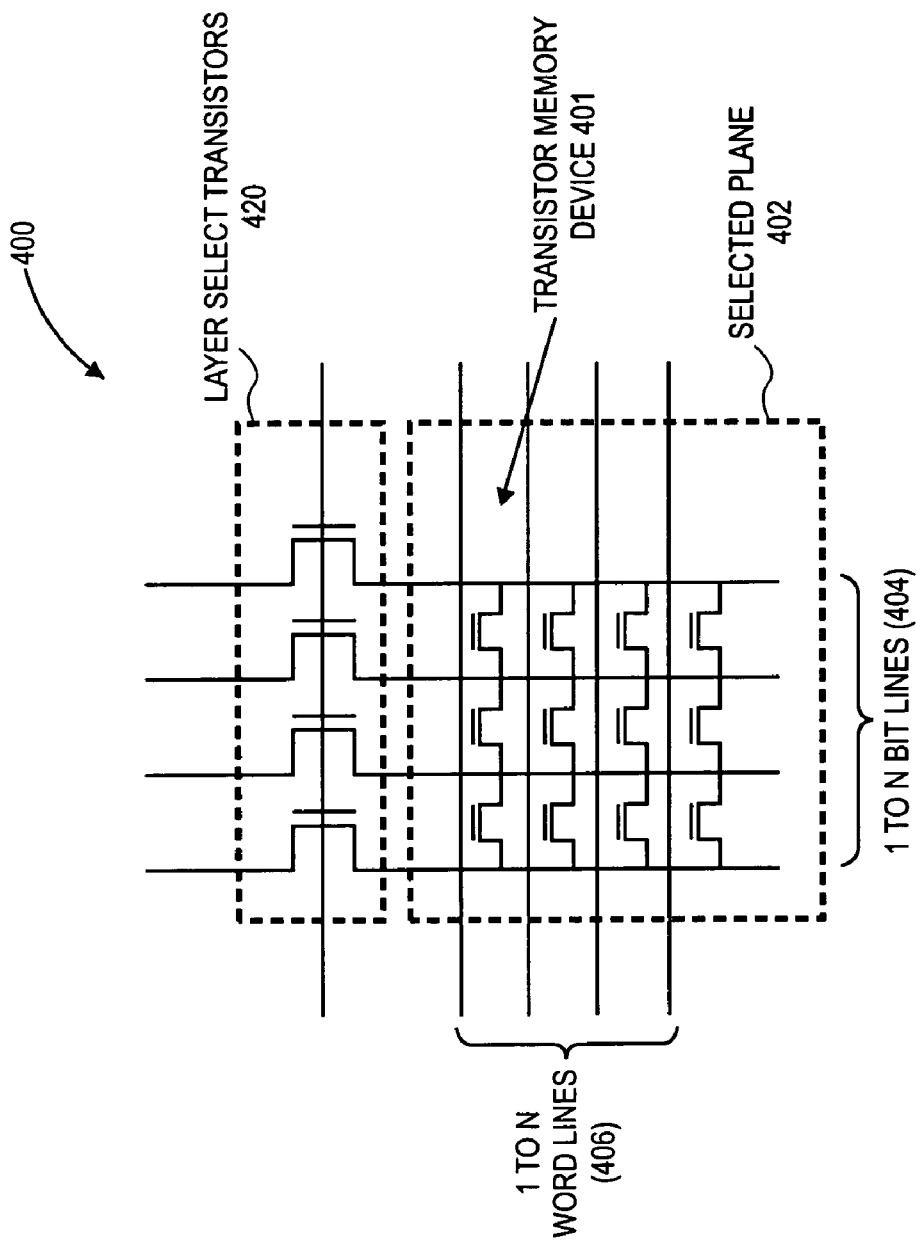
FIG. 4 illustrates an exemplary memory device having a selected horizontal plane with transistor memory devices.

FIG. 4 illustrates an exemplary memory device 400 having a selected horizontal plane 402 with transistor memory devices 401. Layer select transistors 420 are connected to an array of transistor memory devices 401, any of which can activate or choose the selected plane 402. These transistors 420 can be formed on the same plane as horizontal plane 402 or one a different one such as the ground level of the substrate. The array of transistor memory devices 401 is interconnected with 1 to N word lines (406) and bit lines (404). Examples of transistor memory devices include a floating gate transistor (e.g., a Si floating gate transistor), a dielectric trapped charge device (e.g., a nitride trapped transistor), or a nanocrystal device (e.g., a Si nanocrystal transistor).

Figure 5:
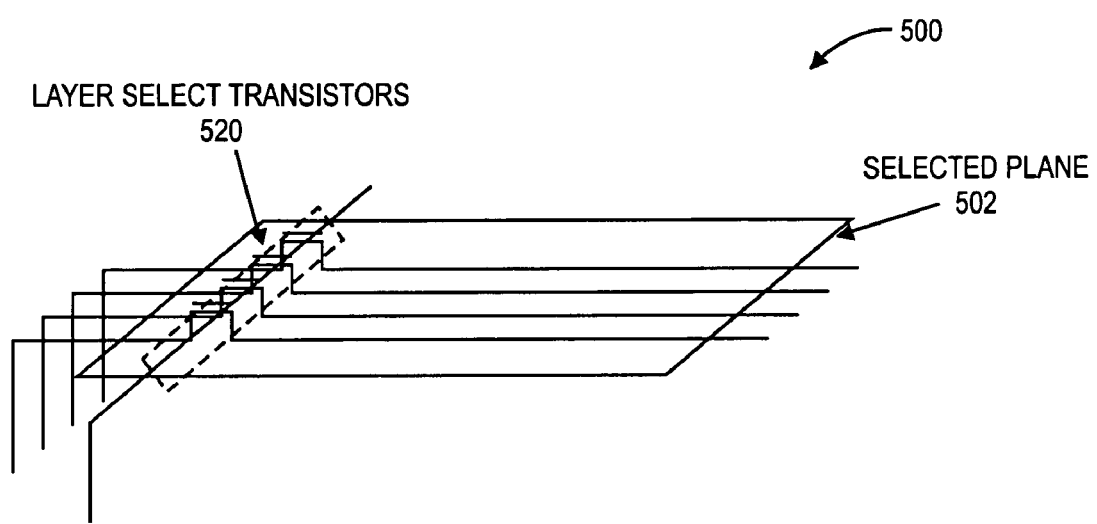
FIG. 5 illustrates an exemplary memory device having layer select transistors on the same plane as the selected plane.
Figure 6:
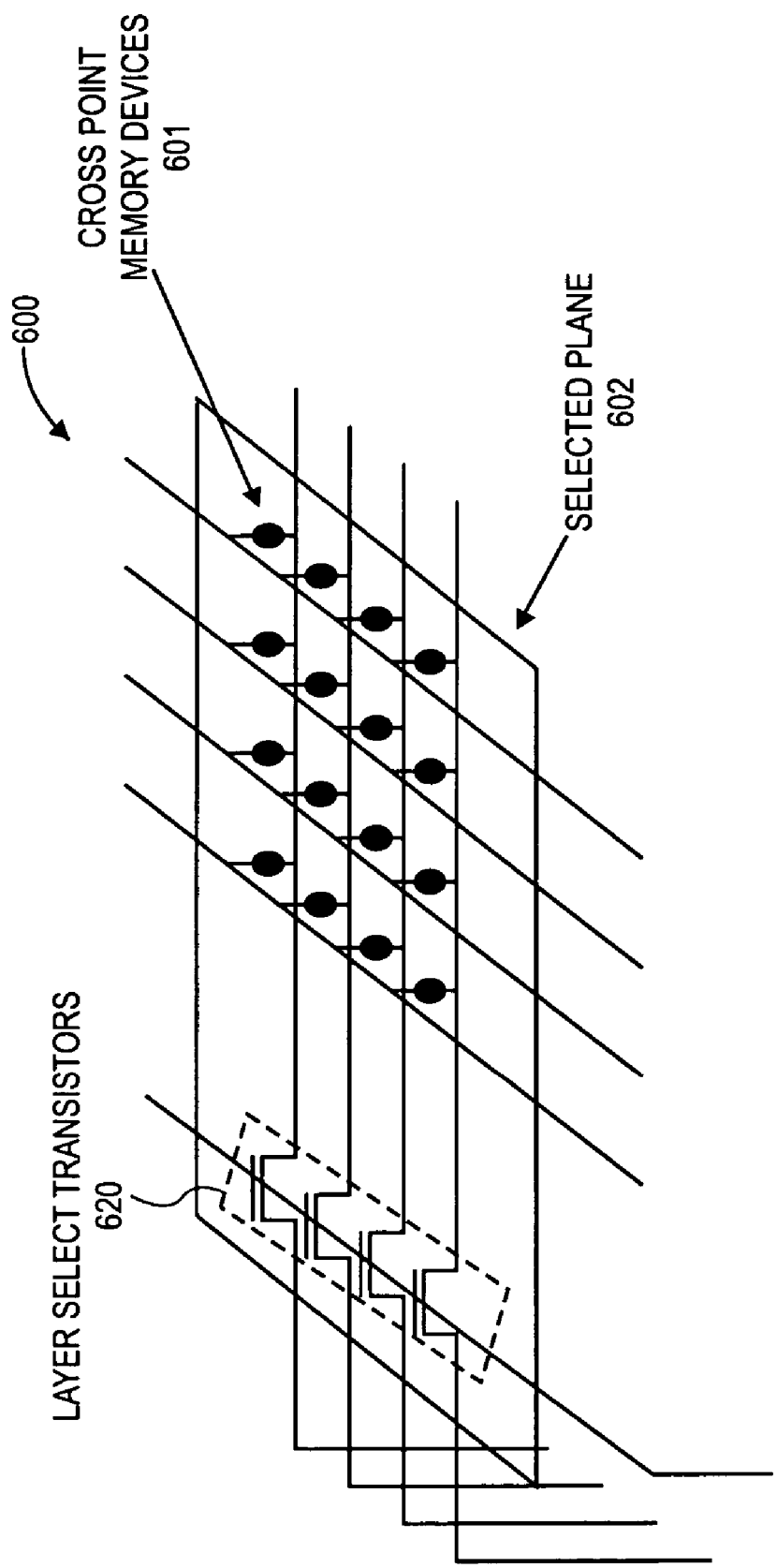
FIG. 6 illustrates an exemplary memory device having layer select transistors on the same plane as the selected plane with cross point memory devices.
Figure 7:
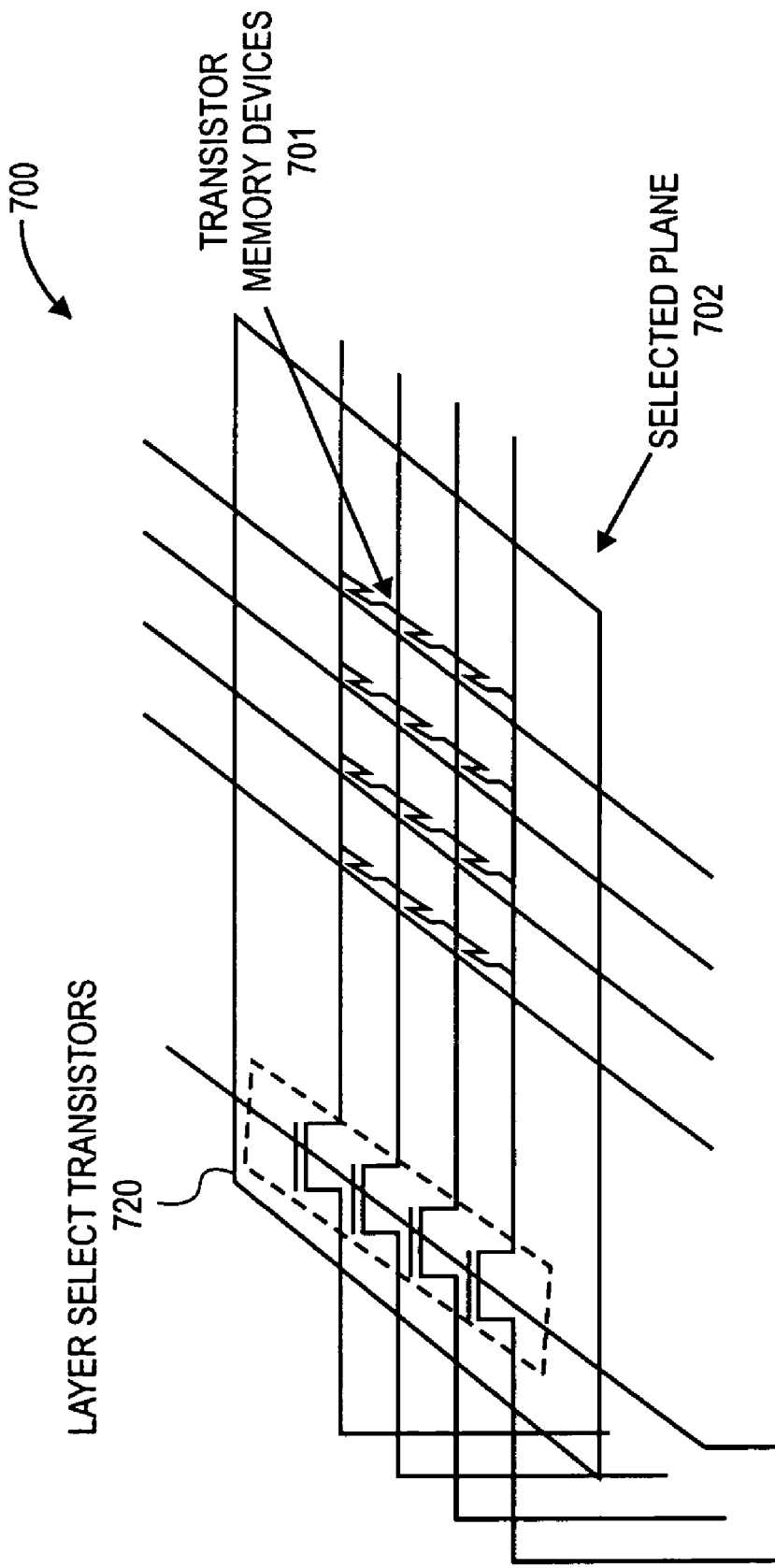
FIG. 7 illustrates an exemplary memory device having layer select transistors on the same plane as the selected plane with transistor memory devices.

FIG. 5 illustrates an exemplary memory device 500 having layer select transistors 520 on the same plane as the selected plane 502. In this example, one or more layer selecting transistors 520 select a memory array or memory cells in the horizontal plane 502 such that the selecting transistors 520 and the memory arrays or cells are part of the same selected plane 502. FIG. 6 illustrates an exemplary memory device 600 having layer select transistors 620 on the same plane as the selected plane 602 with cross point memory devices 601. These memory devices 601 can be the same as described in FIG. 3. The transistors 620 can be used for selecting, controlling, or addressing the cross point memory devices 601. FIG. 7 illustrates an exemplary memory device 700 having layer select transistors 720 on the same plane as the selected plane 702 with transistor memory devices 701. These memory devices 701 can be the same as described in FIG. 4. The transistors 720 can be used for selecting, controlling, or addressing the transistor memory devices 701. These transistors may be fabricated using conventional semiconductor film processes.

Figure 8:
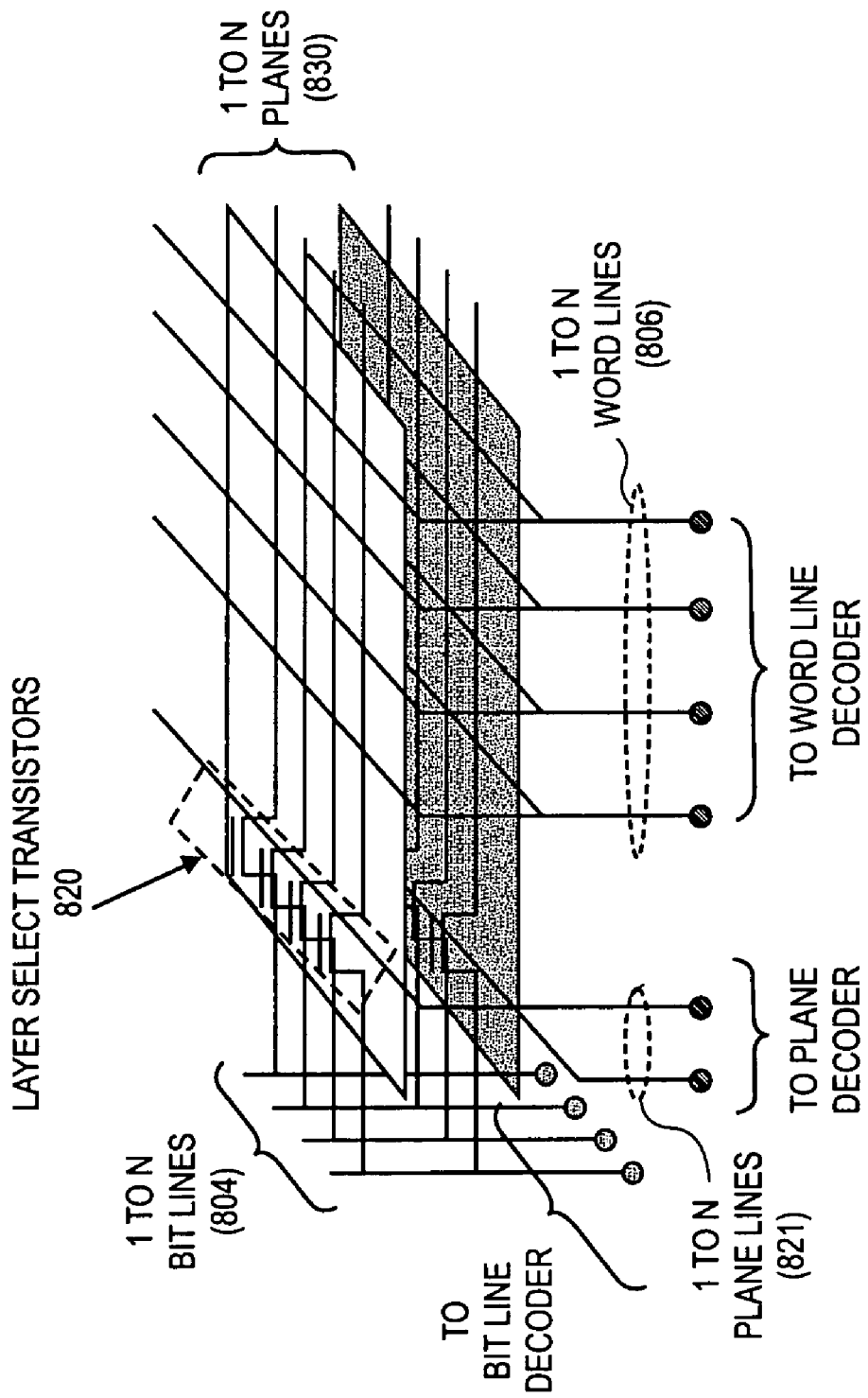
FIG. 8 illustrates an exemplary memory device having layer select transistors on each layer or plane along with interconnections to the plane, word line, and bit line decoders.

FIG. 8 illustrates an exemplary memory device 800 having layer select transistors 820 on each layer or plane along with interconnections to the plane, word line, and bit line decoders. The 1 to N bit lines (804) are connected to a bit line decoder and the 1 to N word lines (806) are connected to a word line decoder. The 1 to N planes lines are connected to a plane decoder. In this example, one of the plane lines 821 connects to layer select transistors 820 on one of the 1 to N layers or planes (830) having memory arrays. Through such interconnections and the plane, word line, and bit line decoders, various memory arrays or memory cells can be selected, controlled, or addressed on any of the 1 to N planes 830.

For example, in the case of reading data from the memory cells on the top plane of planes 830, a plane decoder outputs an appropriate control signal connected to the gates of the layer select transistors on the top one of the planes 830. This causes the select transistors 820 to turn on, which allows signals to pass through to the bit lines 804. The word line decoder connected to the 1 to N word lines (806) can output appropriate control signals to turn the respective memory cells on in that memory array. The bit line decoder connected to the 1 to N bit lines 804 can then read stored data from the memory cells.

Figure 9:
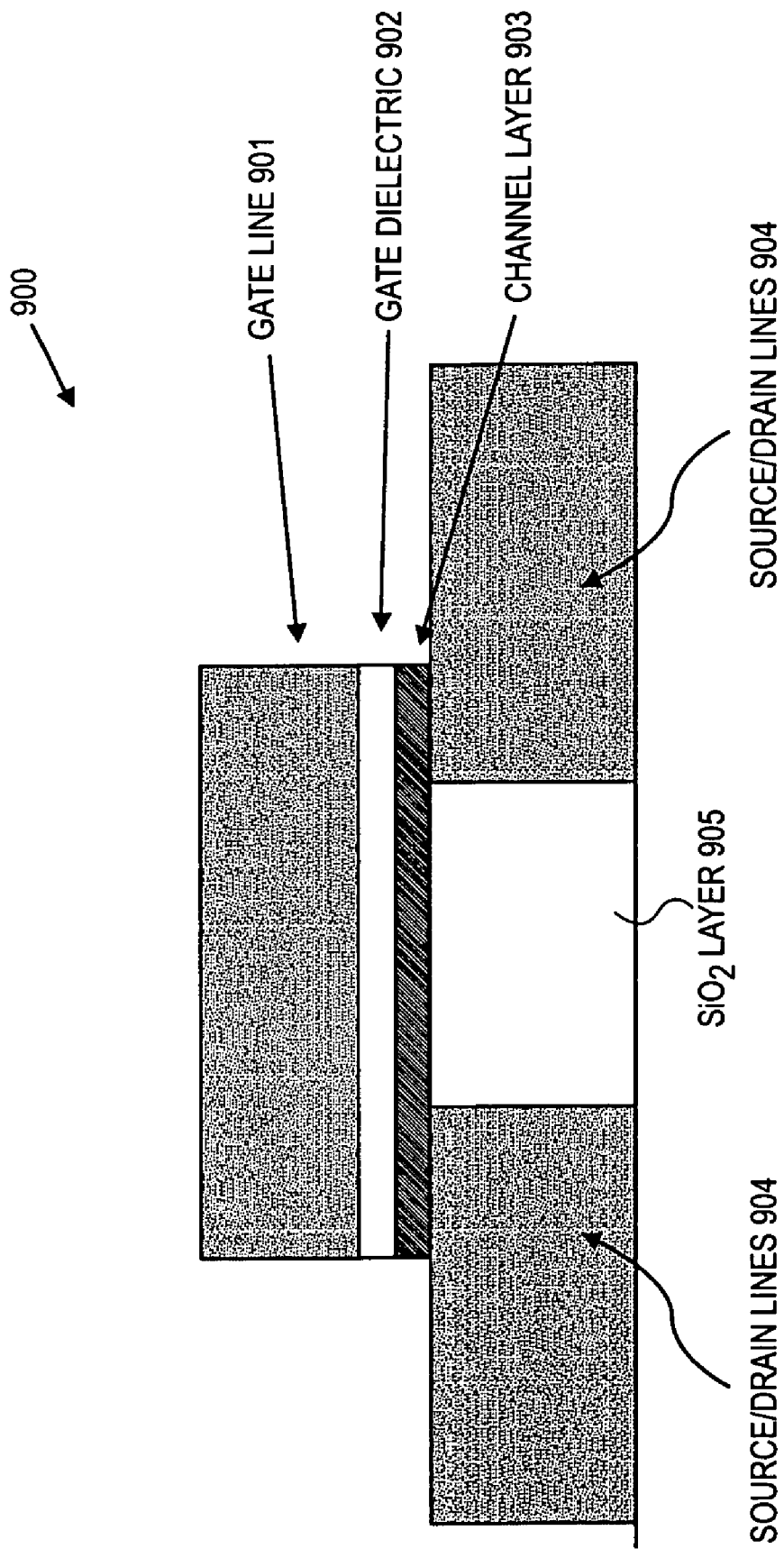
FIG. 9 illustrates one example of a layer select transistor.

FIG. 9 illustrates one example of a select transistor 900. Transistor 900 includes a channel layer 903 formed above source/drain lines 904 and $SiO_2$ layer 905. A gate dielectric 902 is formed above the channel layer 903 and a gate line 901 is formed above the gate dielectric 902. Transistor 900 can be implemented in the examples of FIGS. 1-8, as the layer select transistor. The transistor 900 may include source and drain regions connected to sour/drain lines 904, which may include n-type polysilicon. The channel layer 903 may include a p-type silicon Si layer and formed adjacent to the source and drain regions. The gate dielectric layer 902 may include a silicon dioxide $SiO_2$ layer or a stacked structure comprising $SiO_2$, SiN, and $SiO_2$ layers formed over the channel layer 903. The gate line 901 may include polysilicon formed over the gate dielectric layer 902. The gate lines 901 and source/drain lines 904 can be doped polysilicon lines and include a metal silicide layer to increase conductivity. These lines 901 and 904 can also include W, cobalt Co, Ti titanium, and Ni nickel. The gate lines 901 and source/drain lines 904 can include other suitable metals.

Figure 10:
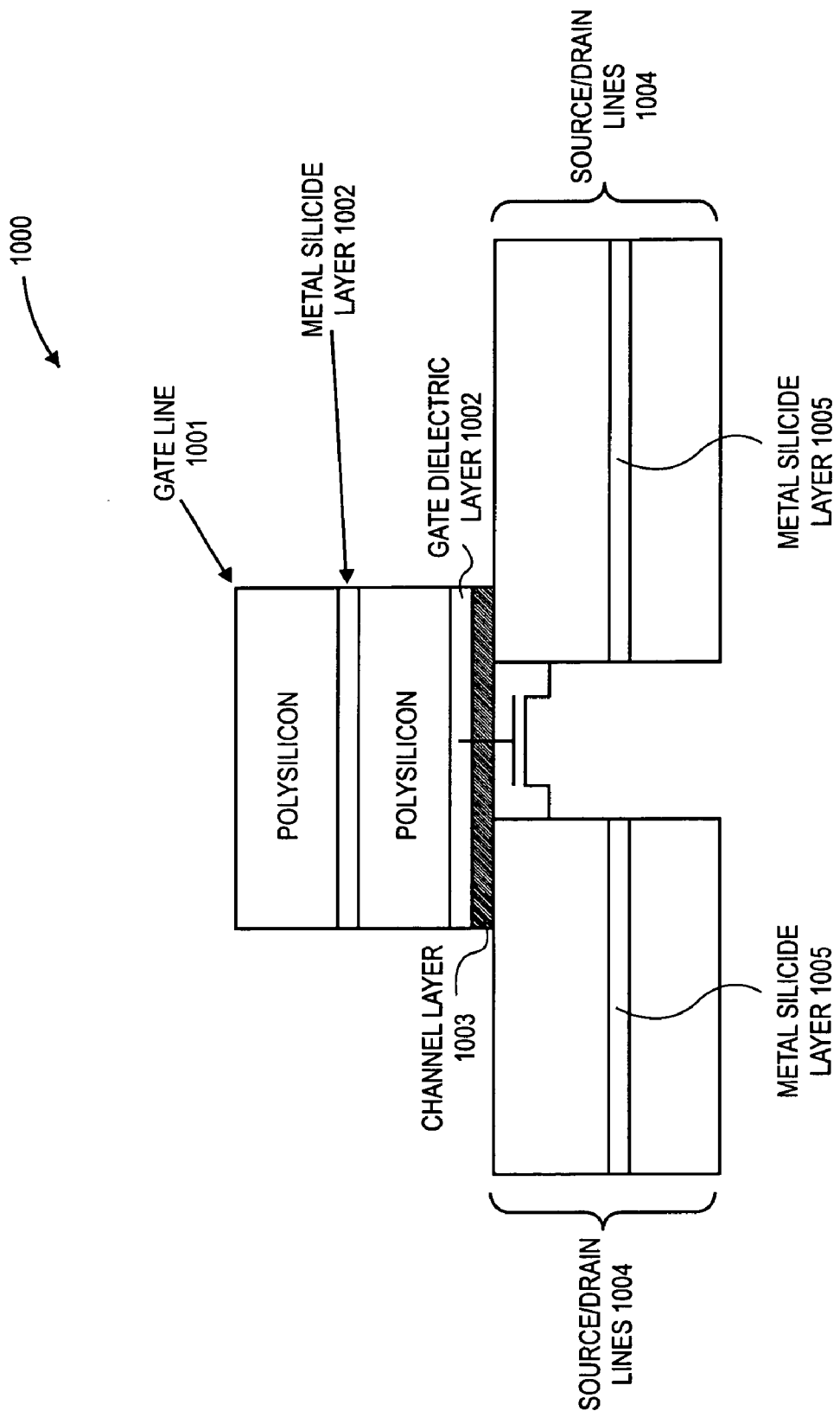
FIG. 10 illustrates another example of a layer select transistor with stacked structures.

FIG. 10 illustrates another example of a layer select transistor 1000 with stacked structures. In this example, the gate lines 1001 and source/drain lines 1004 are stacked structures including metal silicide layers 1002 and 1005, respectively, sandwiched in between polysilicon layers. The polysilicon layers can be replaced with other suitable semiconductor materials. The metal silicide layers 1002 and 1005 can be used to reduce the polysilicon resistance and improve stacking capability, examples of which include sandwiched silicide structures of polysilicon/TiN/$TiSi_2$ (or Wsi/TiN/polysilicon may be used. In some examples, the layer-selecting transistors may be configured and formed in a way to approximate or duplicate the configuration of the memory cells of the corresponding memory array. By having a similar configuration, the layer-selecting transistors may be manufactured together with other memory cells without any or much changes in the manufacturing process.

Figure 11B:
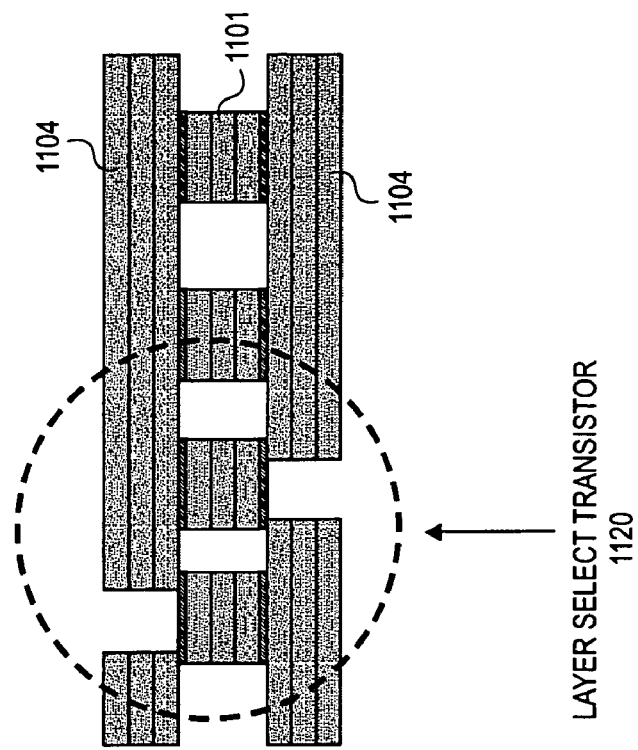
FIG. 11B illustrates one example of a cross-sectional view of the memory device of FIG. 11A.
Figure 11A:
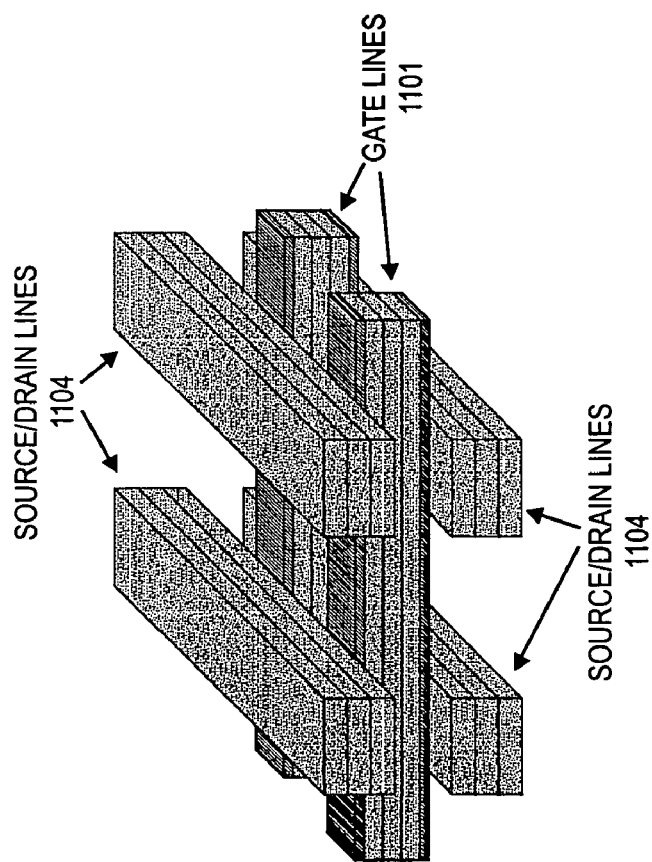
FIG. 11A illustrates one example of a three-dimensional schematic diagram of neighboring layer select transistors having source/drain lines and gate lines.

FIG. 11A illustrates one example of a three-dimensional schematic diagram neighboring layer selecting transistors having source/drain lines 1104 and gate lines 1101. The transistors depicted in FIG. 11 can be inverted and stacked silicon-oxide-nitride-oxide-silicon (SONOS) type transistors as described in the related application "THREE-DEMENSIONAL MEMORY DEVICES." FIG. 11B is a cross-sectional view of the memory device of FIG. 11A showing layer select transistor 1120 with respect to gate lines 1101 and source/drain lines 1104. FIG. 12A illustrates another example of a three-dimensional schematic diagram of neighboring layer selecting transistors having source/drain lines 1204 and gate lines 1201. FIG. 12B illustrates one example of a cross-section view of the memory device of FIG. 12A. In this cross-section view, a layer select transistor 1220 and gate insulator 1225 are shown. The gate insulator 1225 can be formed from multiple layers. In one example, the gate insulator 1225 includes a stacked structure of multiple layers including SiO2/SiN/$SiO_2$, used as a nitride trapped charge storage memory.

Referring to FIGS. 12A and 12B, a bit line (i.e., source/drain line 1204) corresponding to the layer select transistor 1220 may be provided with an opened gap. The two ends neighboring the gap can serve as the source and drain regions of the layer select transistor 1220. In one example, an ion implantation process or etching process on the gate line for the layer select transistors may applied to isolate the leakage path between bit lines. In this manner, fabricating the layer select transistor 1220 allows the transistor to be manufactured together with the corresponding bit line of the corresponding memory array without the need for major redesign of the transistor structure and the fabrication processes. Therefore, the manufacturing of the layer-selecting transistors may be incorporated into the manufacturing processes of the memory cells.

As discussed above, the examples consistent with of the invention may provide a three-dimensional memory device. In addition, the examples above may provide a layer decoding scheme for the three-dimensional memory that may allow simplified decoding circuit design. As noted above, the layer-selecting transistors may be placed on the ground layer. Alternatively, the layer-selecting transistors may be placed on the corresponding layer or plane of the memory array that the layer-selecting transistors are designed to address to.

The examples of the layer decoding scheme noted above may be suitable to cross-point memories as well as transistor memories. In some examples, cross-point memory may be fuse memory, antifuse memory, phase-change memory, resistor-changeable memory, or capacitor-changeable memory. In some examples, transistor memory may be floating gate memory, charge-trapping memory, or nanocrystal memory. Additionally, the memory cells in some examples may be nonvolatile or volatile. For the layer-selecting transistors, they can be made of thin-film transistors using single crystal, poly-crystal, amorphous, or polymer semiconductor.

In one example, the use of a layer decoding scheme may reduce design complexity. Furthermore, products with a three-dimensional matrix design may easily vary the density of memory cells by varying the layer number without changing the circuits. And the layer decoding scheme using layer-selecting transistors placed on the corresponding layers may reduce the chip area needed for the entire memory device.

The foregoing disclosure of various examples consistent with the present invention has been presented for purposes of illustration and description. It is not intended to be exhaustive or to limit the invention to the precise forms disclosed. Many variations and modifications can be made to the examples described herein without departing from the scope of the intention. The scope of the invention is to be defined only by the claims appended hereto, and by their equivalents.

Further, in describing those examples, the specification may have presented the method and/or process in a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A memory device comprising:
   a plurality of planes of memory arrays, each memory array including a plurality of memory cells;
   a plurality of word lines and bit lines coupled to the memory cells in each plane; and
   at least one transistor to select at least one of the memory arrays.

2. The memory device of claim 1, further comprising:
   a decoder to activate the at least one transistor.

3. The memory device of claim 2, wherein the decoder selects one of the memory arrays in a horizontal plane.

4. The memory device of claim 2, wherein at least one transistor is located on the same or different plane as the selected memory array.

5. The memory device of claim 1, wherein the memory cells include a cross point memory device or a transistor memory device.

6. A memory device comprising:
   at least two layers of memory arrays each containing at least four memory cells;
   at least two word lines in each layer coupled with the memory cells of the corresponding layer;
   at least two bit lines in each layer coupled with the memory cells of the corresponding layer; and
   at least a set of layer-selecting transistors for each layer, each set of the layer-selecting transistors being coupled to the memory cells of the corresponding layer.

7. The memory device of claim 6, wherein each set of the layer-selecting transistors is coupled to the memory cells of the corresponding layer through the bit lines coupled to the memory cells of that layer.

8. The memory device of claim 6, wherein each set of the layer-selecting transistors is coupled to memory cells of the corresponding layer through the word lines coupled to the memory cells of the layer.

9. The memory device of claim 6, wherein each set of the layer-selecting transistors is controlled by a plane decoding signal.

10. The memory device of claim 6, wherein at least one set of the layer-selecting transistors is placed on the corresponding layer along with the memory cells of that layer.

11. The memory device of claim 6, wherein at least one set of the layer-selecting transistors is placed on at least one of a ground layer and a raised layer of the memory device.

12. The memory device of claim 6, wherein at least one set of the layer-selecting transistors comprises at least one of a floating-gate device, a thin film transistor, and a dielectric-trapped-charge device.

13. The memory device of claim 6, wherein the memory device is a three-dimensional memory device.

* * * * *